United States Patent [19]

Kuyel

[11] Patent Number: 4,537,813
[45] Date of Patent: Aug. 27, 1985

[54] PHOTOMASK ENCAPSULATION

[75] Inventor: Birol Kuyel, Hopewell Township, Mercer County, N.J.

[73] Assignee: AT&T Technologies, Inc., New York, N.Y.

[21] Appl. No.: 488,315

[22] Filed: Apr. 25, 1983

Related U.S. Application Data

[63] Continuation-in-part of Ser. No. 425,834, Sep. 27, 1982, abandoned.

[51] Int. Cl.$^3$ .................. G03F 1/00; H01L 21/30
[52] U.S. Cl. ..................... 428/209; 428/701; 428/450; 428/210; 430/5
[58] Field of Search ............ 428/209, 210, 450, 701; 427/96; 430/5

[56] References Cited

U.S. PATENT DOCUMENTS

| | | | |
|---|---|---|---|
| 3,669,770 | 6/1972 | Feldstein | 156/657 |
| 3,743,417 | 7/1973 | Smatlak | 355/125 |
| 3,801,410 | 4/1974 | Detrick et al. | 29/570 |
| 3,811,893 | 5/1974 | Geradus et al. | 430/5 |
| 3,873,203 | 3/1975 | Stevenson | 355/133 |
| 3,897,251 | 7/1975 | Detrick et al. | 430/5 |
| 3,906,133 | 9/1975 | Flutie | 428/172 |
| 3,947,618 | 3/1976 | Gruss | 428/209 X |
| 4,014,037 | 3/1977 | Matsushita et al. | 357/52 |
| 4,022,927 | 5/1977 | Pfeiffer et al. | 430/5 |
| 4,049,347 | 9/1977 | Smith, Jr. | 350/322 |
| 4,178,404 | 12/1979 | Allen et al. | 428/209 |
| 4,361,643 | 11/1982 | Banks et al. | 430/396 |
| 4,405,701 | 9/1983 | Banks et al. | 428/209 X |

FOREIGN PATENT DOCUMENTS

| | | |
|---|---|---|
| 2280924 | 8/1974 | France . |
| 94770 | 8/1978 | Japan . |
| 115042 | 9/1980 | Japan . |
| 1210140 | 10/1970 | United Kingdom . |

OTHER PUBLICATIONS

IBM Tech. Disc, vol. 14, No. 1, Jun. 1971, J. Sybalski.

Primary Examiner—George F. Lesmes
Assistant Examiner—Nancy A. B. Swisher
Attorney, Agent, or Firm—D. J. Kirk; R. B. Levy

[57] ABSTRACT

A photomask (50) used for form patterns on a resist coated semiconductor wafer is comprised of a light transmissive baseplate (52) having a metallic pattern (54) thereon. A plasma deposited SiO$_2$ conformal, electrically resistive, coating (56) covers the patterned baseplate (52), wherein the coating material is substantially the same refractive index as the baseplate.

4 Claims, 5 Drawing Figures

PHOTOMASK ENCAPSULATION

CROSS REFERENCE TO RELATED APPLICATION

This application is a continuation-in-part of our co-pending U.S. patent application Ser. No. 425,834, filed Sept. 27, 1982, entitled "Photomask Encapsulation" which is assigned to the instant assignee, now abandoned.

TECHNICAL FIELD

The instant invention relates to integrated circuit photomasks. In particular, the invention is directed to photomasks and techniques for manufacturing and using same in projection printing.

BACKGROUND OF THE INVENTION

Photomasks used for projection printing, wherein the photomask is spaced from a resist coated semiconductor wafer or the like, have high resolution metallic patterns on glass substrates, with feature sizes rapidly approaching the 1 $\mu$m to 2 $\mu$m range. The quality of the pattern is very critical to the semiconductor manufacturing process, and the photomasks are therefore produced substantially free from any defects. Maintaining the photomasks in this defect free state is essential if acceptable device yields are to be achieved. In addition to particulate contamination, the various cleaning and handling operations that the photomask is subjected to can cause a slow deterioration of the pattern.

Additionally, the metallized pattern is an electrical conductor, while the underlying glass substrate is an insulator. Therefore, by various means (e.g., electrostatic, UV illumination-emission of photoelectrons) each portion of the metallic pattern can, undesirably, be charged to a different electrical potential. When a potential difference of a few volts occurs over a distance of approximately one micron, an electrical discharge can take place. This discharge ablates material from the metallic pattern causing erosion and/or pinholes therein. When the aforementioned defects are multiplied by the six or more masks required to fabricate a semiconductor device the yield loss can become significant.

One approach to protecting the metallic photomask pattern would be to deposit a simple protective coating thereon as described in U.S. Pat. No. 3,906,133 to Flutie. That patent describes an iron oxide masking layer on a transparent substrate which has a protective nitrocellulose coating thereon of a thickness greater than the height of protrusions on the surface of a resist coated wafer to be processed. However, the Flutie patent is directed to contact printing wherein the photomask is placed in intimate contact with the photoresist coated wafer. In projection printing, the photomask is spaced from the resist coated wafer and the light passing through the photomask must be focused onto the resist coating by an optical system. It has been found that such protective coatings do not have uniform thickness and cause diffraction of the light due to the difference between the refractive index of the substrate and the coating material, resulting in poor pattern definition which yields unacceptable product.

Additionally, nitrocellulose film coatings have other disadvantages for VLSI mask protection applications. Since the coating is plastic it can easily be scratched and being a good dielectric its surface can readily charge. The surface charge electrostatically attracts particles raising the level of defects above VLSI requirements. Such masks have to be cleaned much more frequently to remove those particles, resulting in a loss of throughput. As VLSI design rules shrink, smaller and smaller particles will cause fatal defects, and such particles not only can be accumulated much faster with charged surfaces, but they are also much more difficult to remove with known cleaning techniques. Consequently, the combination of need for more frequent cleaning, susceptability of the surface to scratches during cleaning, and accumulation of unremovable defects will result in frequent removal and reapplication of such film which can cause further defects in the mask pattern.

An alternative solution to providing mask protection is described in U.S. Pat. No. 4,361,643 issued Nov. 30, 1982 to Banks et al., assigned to the instant assignee and entitled "A Photomask and Method for Fabricating Same" which is assigned to the instant assignee. Banks et al. describe a technique whereby a planar, transparent coverplate is placed in intimate contact with the patterned surface of a transparent baseplate. An index matching material, substantially the same index as both the coverplate and the baseplate, is interposed therebetween. Such a mask has been proven to be most effective for forming well defined patterns on semiconductor substrates. However, the coverglass must have a uniform thickness which makes it difficult and expensive to fabricate.

Accordingly, there is a need for an inexpensive technique for protecting the metallized surface of a mask while maintaining acceptable definition with low defect densities.

SUMMARY OF THE INVENTION

The instant invention overcomes the foregoing problems with a photomask comprised of a light transmissive, selectively metallized, baseplate; and a light transmissive, electrically resistive, coating having substantially the same refractive index as the substrate, covering the selectively metallized baseplate. In a particular embodiment, the resistive coating is applied using plasma deposition techniques.

DETAILED DESCRIPTION

Figure 1:
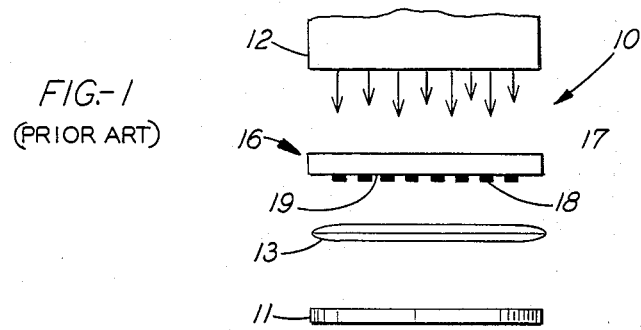
FIG. 1 is a schematic view representing a prior art projection printing system.

During the fabrication of integrated circuits or the like, a light projection system, generally indicated by the numeral 10 in FIG. 1 has been used. A semiconductor wafer 11 having a resist coating (not shown) is vertically aligned with an ultraviolet source 12 and focusing optics 13. Such a projection system 10 is manufactured by the Perkin-Elmer Company, as their Microline Model No. 240.

In operation, a photomask 16 is interposed between the ultraviolet source 12 and the focusing optics 13. The photomask 16 is comprised of a transparent substrate 17 such as fused silica with a metallic pattern 18 thereon. The ultraviolet radiation from the source 12 passes through the unmetallized areas 19 on the photomask 16 and is focused by the optics 13 onto the resist coating on the semiconductor wafer 11 to expose and insolubilize (i.e., when using a negative acting resist) the coating. A suitable solvent is then employed to wash away the soluble resist coating in order that the exposed areas be further processed. Such a procedure is usually repeated a number of times using a plurality of photomasks 16 having different patterns 18 thereon to fabricate the desired circuits. Although the metallic pattern 18 does not contact the resist coated wafer 11 various cleaning and other handling operations result in deterioration of the pattern. Additionally, electrical charges can build up on the metallic portions resulting in subsequent electrical discharges which undesirably ablate material from the pattern.

As hereinbefore indicated, in reference to Flutie, a protective nitrocellulose coating (not shown) deposited on the metallic pattern 18 on the photomask 16 has been found unacceptable for use in projection printing systems. Accordingly, a photomask 30 (see FIG. 2) developed by Banks et al. is comprised of a transparent baseplate 31 having a metallic pattern 32 thereon and a substantially flat, transparent, coverplate 33 placed over the patterned baseplate. Additionally, an index matching fluid 34 fills in the unmetallized volume between the baseplate 31 and the coverplate 33 to substantially eliminate interference fringes produced by light reflecting from the two surfaces in near contact. Bonding material 36 at the interface edge 37 between the baseplate 31 and the coverplate 33 holds the coverplate in place on the baseplate while sealing the index matching fluid 34 therein.

Figure 2:
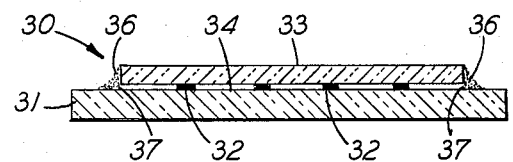
FIG. 2 is a cross-sectional view of a prior art photomask.

As hereinbefore indicated, the photomask 30 of FIG. 2 has been found to be most effective but is expensive, difficult to repair and requires substantial time to fabricate.

Figure 3:
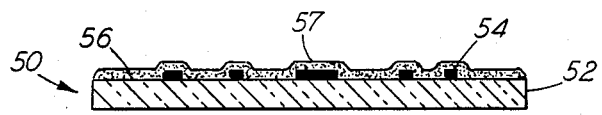
FIG. 3 is a cross-sectional view of the instant mask.

The instant mask 50, shown (not to scale) in FIG. 3, overcomes the foregoing problems. The mask 50 is comprised of a light transmissive baseplate 52 having a metallic pattern 54 thereon. A plasma deposited resistive coating 56 covers the baseplate 52 and the pattern 54 thereon. The coating material 56 is substantially the same material as the substrate 52. Accordingly, both the coating 56 and the substrate 52 have substantially the same index of refraction (approximately 1.5) which effectively eliminates the interface therebetween and any undesirable refraction or reflections at such an interface.

Advantageously, such a conformal, plasma deposited, coating 56 on the patterned substrate 52 has been found effective in protecting the mask during use, handling and cleaning. Furthermore, when the coating 56 is a dielectric material such as plasma deposited $SiO_2$, having very high threshold breakdown field strengths (250,000 volts/cm compared to approximately 20,000 volts/cm in air), any electrical discharge between portions of the metallized pattern is substantially suppressed. Such suppression eliminates the aforementioned undesirable ablating of portions of the metallized pattern.

Although many dielectric and glass films may have very high electrical breakdown threshold field strengths they do not provide adequate static protection since they also have extremely high (substantially infinite) resistivity. Unfortunately, such films can be readily charged and such charge will decay slowly. Accordingly, a pure dielectric film can charge to very high voltages during high pressure DI water cleaning of the mask. Also a pure dielectric would not prevent the metallized pattern on the mask from charging during UV exposure.

Additionally, a static charge on the coated mask will attract particles which will register as defects. However, it has been discovered that if the coating is plasma deposited $SiO_2$ it will not charge and will attract substantially no particles. Furthermore, any particle depositing on the uncharged surface can be much more readily removed therefrom than from a charged surface.

In a particular embodiment, the surface resistivity of the plasma deposited $SiO_2$ film 56 has been found to be $1.5 \times 10^{11}$ ohm-cm, which is a lossy dielectric, sufficiently low that neither the film nor the metallized mask patterns 54 can maintain a charge (charge relaxation time is 29 m sec.) when the film is in contact with a grounded mask holder (not shown). Consequently, particles will not be attracted to the surface 57 of the coating 56 and cleaning of the mask 50 is facilitated.

Figure 4:
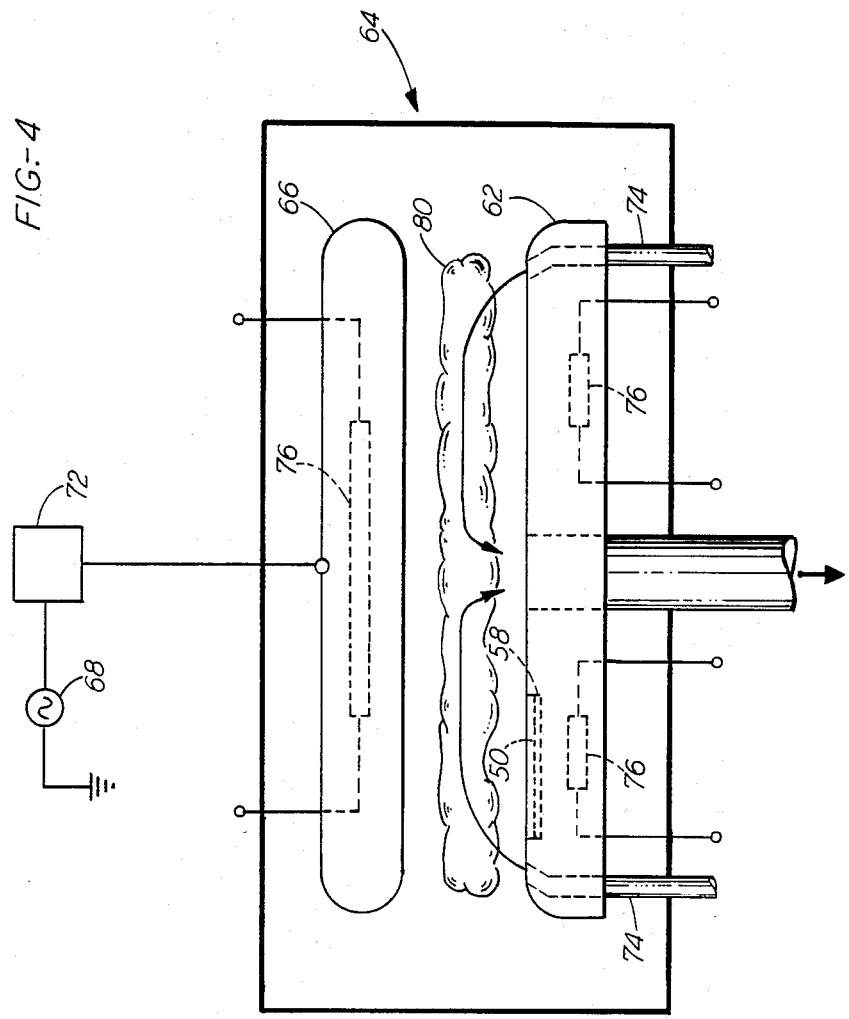
FIG. 4 is a schematic view of an apparatus used to deposit a protective coating on the mask.

In a particular embodiment the $SiO_2$ coating was deposited on the mask 50 as depicted schematically in FIG. 4. The mask 50 comprised of a glass substrate 52, approximately 0.100 inch thick, having a thin chrome pattern 54 (not shown), is positioned in a depression 58 in a lower aluminum electrode 62 within a plasma deposition chamber 64 (Plasma Therm PK 2430 Reactor). A second aluminum electrode 66 mounted in spaced, parallel relation to the first electrode 62 is connected to an RF current supply 68 (e.g., 46 watts at 13.56 MHz) via a tuner 72, inlet 74 provides 32 cc/min Ar, 1920 cc/min $N_2O$, and 48 cc/min $SiH_4$ at 1 Torr. Resistance heaters 76—76 connected to a power source (not shown) maintain the top electrode 66 at approximately 51° C. and the bottom electrode 62 at about 256° C.

In operation, the system is very slowly pumped down to reduce particle transport onto the surface of the patterned substrate 52. Gases are directed into the inlets 74—74 and the potential across the electrodes 62 and 66 generates a plasma 80 therebetween as is well known in the art. $SiO_2$ deposit builds up conformally on the surface of patterned substrate 50. The operation continues for approximately 17 minutes until a thickness of the coating 56 of about $1\mu$ is attained, the process concluded and the system is very slowly vented.

A number of such masks 50 have been fabricated having an acceptable defect density. As an experiment 30 locations on the mask were identified as having defects in the $SiO_2$ coating using the KLA mask inspection tool. However, when the pattern was printed using the Perkin Elmer projection printer none of the defects were printed. That is to say, due to some unexplained reason effective defect density of this film is much less than the defect density count obtained using the conventional KLA mask inspection tool.

The plasma deposition process produces a conformal resistive coating 56 on the surface, whatever the surface topography might be. Therefore, no voids are left as film slowly builds. Advantageously, such $SiO_2$ coating may also be cleaned or removed using a plasma etching technique in the same reactor and may be readily repaired when scratched by simply placing the mask 50 in the chamber 64 to remove the coating and redeposit $SiO_2$ thereon. In addition, by controlling the $H_2$ content of the film or doping with metallic ions, resistivity of the film can be varied as desired. Furthermore, the SiO2 coating does not scratch easily during cleaning and handling.

Figure 5:
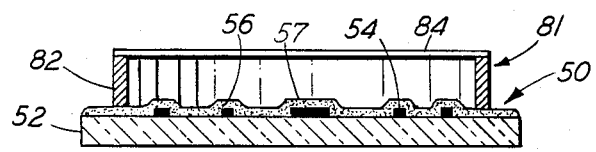
FIG. 5 is a cross-sectional view of the instant mask having a pellicle thereon.

A further embodiment of the instant invention is a mask 50 fabricated with a pellicle 81 thereon (see FIG. 5). The structure and use of pellicles are described in an article entitled "Pellicles—An Industry Overview" by Winn et al. on pages 41 to 43 in *Solid State Technology* dated June 1982 which is incorporated herein by reference. As can be seen in FIG. 5 the pellicle 81 is comprised of an annular metallic ring 82 having a very thin (e.g., 2.5 microns) membrane 84 stretched thereacross. The pellicle 81 is fixedly attached to the mask 50 by double-backed tape or other fastening techniques well known in the art. The pellicle 81 is designed to prevent particles from depositing on the surface of an uncoated metallized mask pattern. The particles will deposit on the membrane 84 but due to the stand-off distance from the surface of the mask 50 they will be out of focus and will not be printed during the resist exposure process.

Although pellicles 81 have been effective to protect uncoated masks it is still necessary to assure cleanliness during mounting thereof to the mask which may require a plurality of mounting and cleaning attempts which cah result in electrostatic damage and contamination to the surface of the uncoated mask. Advantageously, the combination of a coated mask 50 and a pellicle 80 substantially preclude the foregoing problems in that substantially all particles located between the surface 57 of the resistive coating 56 and the membrane 84 will be attracted to the membrane and put out of focus.

It is to be understood that the embodiments described herein are merely illustrative of the principles of the invention. Various modifications may be made thereto by persons skilled in the art which will embody the principles of the invention and fall within the spirit and scope thereof.

For example the instant invention is described in terms of depositing a coating using plasma deposition. However, such description is for purposes of exposition and not for limitation for other techniques may be used to deposit resistive coatings wherein doped glasses or irradiated plastics may be used. Additionally, plasma deposited coatings are also taken to include plasma enhanced low pressure chemical vapor deposition (LPCVD) processes wherein pressures on the order of 0.5 to 1.0 Torr and temperatures in the range of 400° C. may be used.

Additionally, although the instant invention has been described as to use in projection printing it can clearly be used in contact printing. Contact printing masks having a plasma deposited SiO2 coating thereon provide mechanical protection which can prolong the life of the mask.

What is claimed is:

1. A photomask comprising:
    a light transmissive, selectively metallized baseplate; and
    a plasma deposited, electrically resistive SiO2 coating conformally covering the baseplate wherein the coating is a lossy dielectric and has substantially the same refractive index as the baseplate.

2. The photomask according to claim 1 when a pellicle is fixedly mounted to the coated, metallized substrate.

3. The photomask according to claim 1 wherein the coating has a breakdown threshold field strength on the order of 250,000 v/cm.

4. The photomask according to claim 1 wherein the baseplate is fused silica.

* * * * *